(12) United States Patent
Fukumaki et al.

(10) Patent No.: US 10,304,743 B2
(45) Date of Patent: May 28, 2019

(54) SEMICONDUCTOR DEVICE AND MANUFACTURING METHOD THEREOF

(71) Applicant: Toshiba Memory Corporation, Minato-ku (JP)

(72) Inventors: Naomi Fukumaki, Yokkaichi (JP); Masaaki Hatano, Yokkaichi (JP); Seiichi Omoto, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 49 days.

(21) Appl. No.: 15/262,385

(22) Filed: Sep. 12, 2016

(65) Prior Publication Data

US 2017/0352622 A1    Dec. 7, 2017

Related U.S. Application Data

(60) Provisional application No. 62/344,719, filed on Jun. 2, 2016.

(51) Int. Cl.
*H01L 29/06* (2006.01)
*H01L 23/485* (2006.01)
*H01L 21/8234* (2006.01)

(52) U.S. Cl.
CPC .... *H01L 21/823475* (2013.01); *H01L 23/485* (2013.01); *H01L 29/0642* (2013.01)

(58) Field of Classification Search
CPC ............. H01L 21/28518; H01L 29/665; H01L 21/28052; H01L 21/28097; H01L 51/105; H01L 23/53223; H01L 23/53238; H01L 23/53252; H01L 23/53266; H01L 21/76841; H01L 29/66477; H01L 29/66659; H01L 29/66674; H01L 29/07
See application file for complete search history.

(56) References Cited

U.S. PATENT DOCUMENTS

| | | | | |
|---|---|---|---|---|
| 9,466,727 B1* | 10/2016 | Hsu | ..................... | H01L 29/7869 |
| 2007/0161218 A1* | 7/2007 | Ichinose | ............. | H01L 21/0206 |
| | | | | 438/519 |
| 2008/0251855 A1* | 10/2008 | Besser | .............. | H01L 21/28518 |
| | | | | 257/377 |
| 2013/0316535 A1* | 11/2013 | Shin | ........................ | H01L 21/28 |
| | | | | 438/682 |

FOREIGN PATENT DOCUMENTS

| | | |
|---|---|---|
| JP | 5-3170 | 1/1993 |
| JP | 5-152250 | 6/1993 |
| JP | 2010-109183 | 5/2010 |

* cited by examiner

*Primary Examiner* — Moazzam Hossain
*Assistant Examiner* — Stanetta D Isaac
(74) *Attorney, Agent, or Firm* — Oblon, McClelland, Maier & Neustadt, L.L.P.

(57) ABSTRACT

A semiconductor device according to this embodiment includes a semiconductor layer, a plurality of diffusion layers in the semiconductor layer, a gate insulating film, a gate electrode, first contacts, and second contacts. The gate insulating film is on the semiconductor layer between the plurality of diffusion layers. The gate electrode is on the gate insulating film. The first contacts include silicide layers of the same material which are on the gate electrode and the diffusion layers respectively, and first metal layers on the silicide layers. The second contacts are on the first contacts.

1 Claim, 6 Drawing Sheets

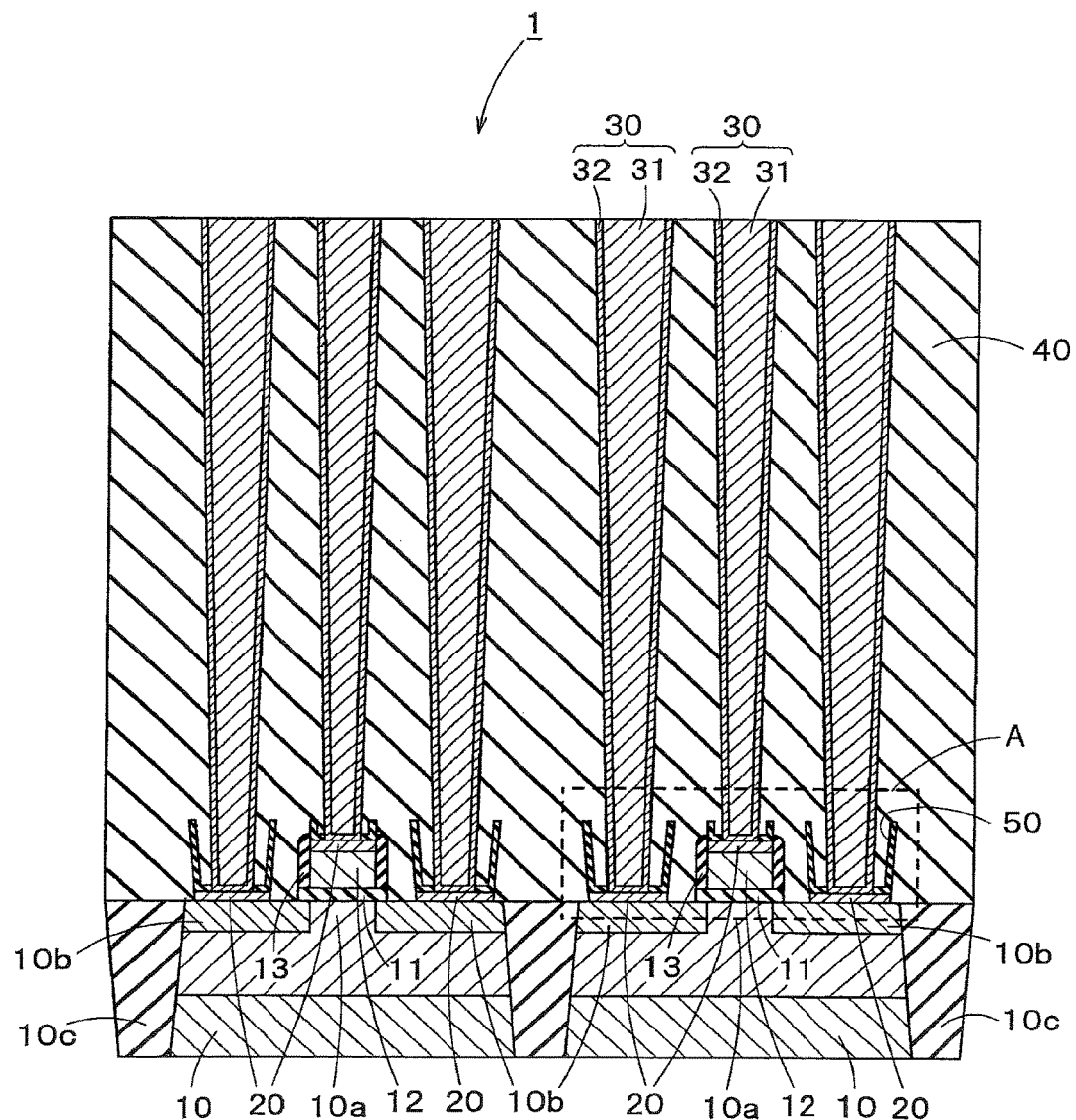
F I G. 1

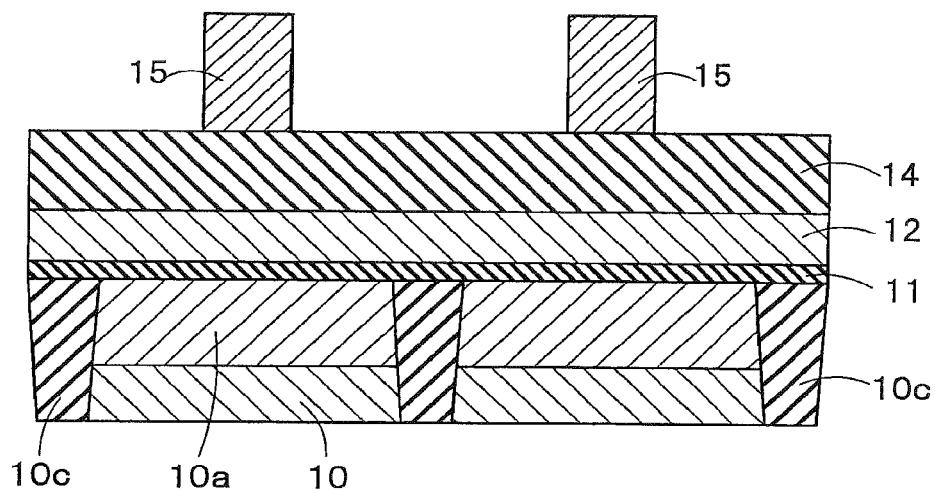
F I G. 4
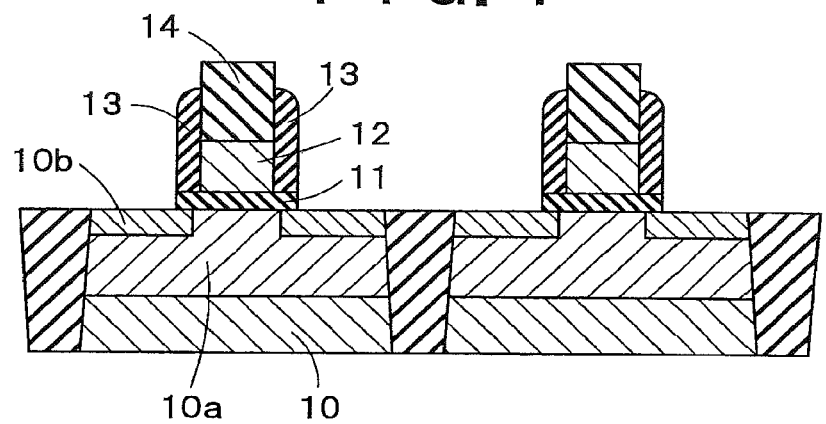
F I G. 5
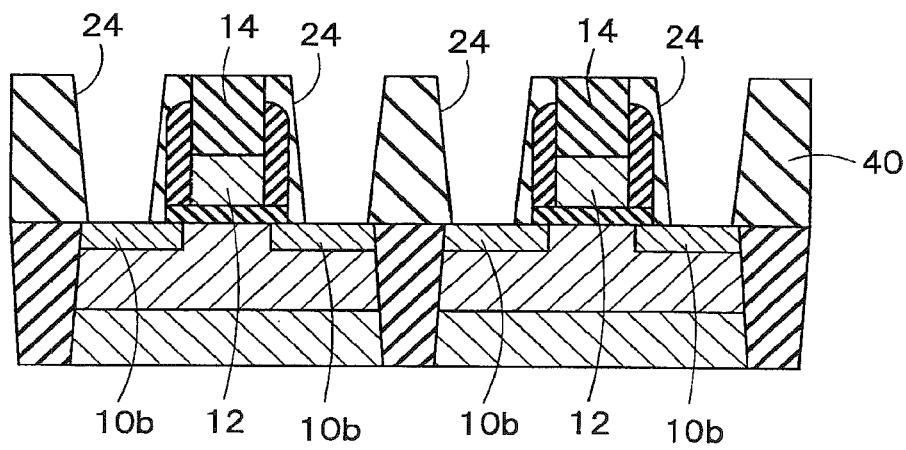
F I G. 6

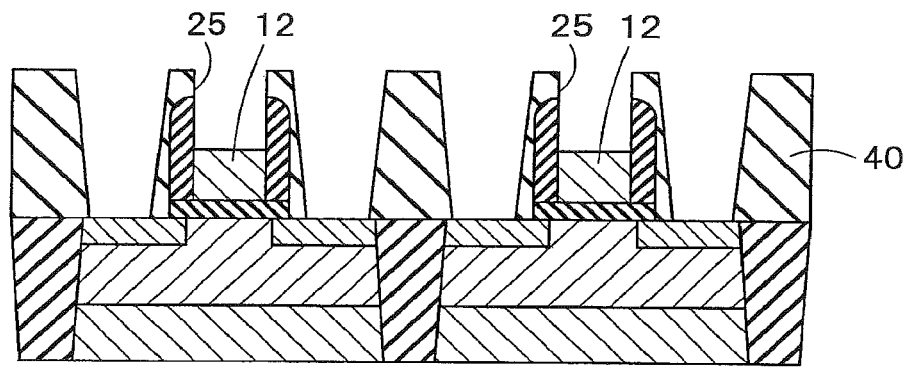
F I G. 7
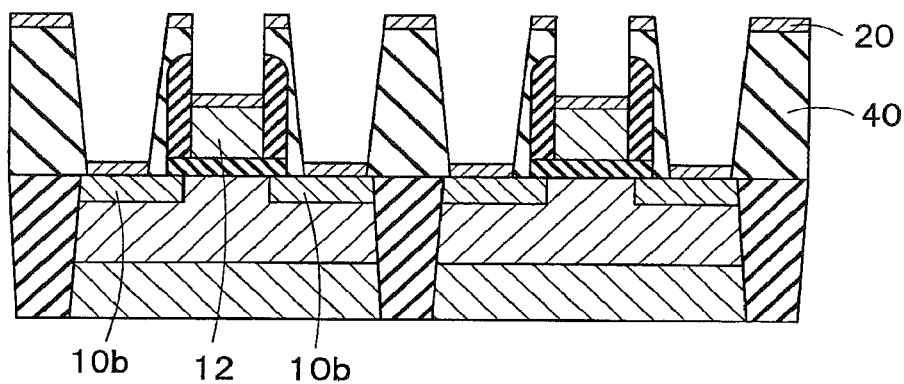
F I G. 8
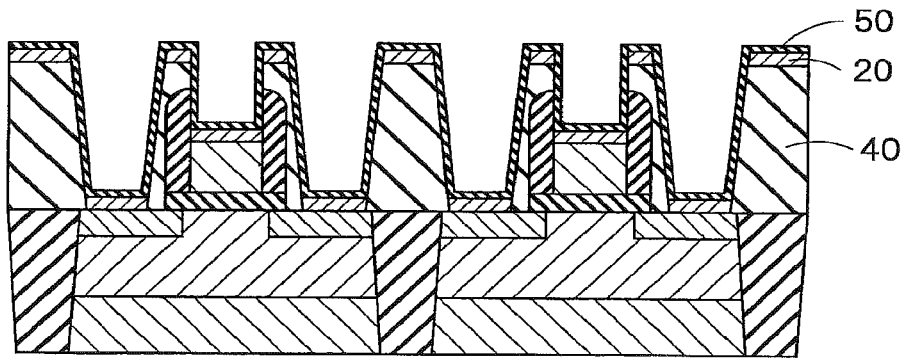
F I G. 9

SEMICONDUCTOR DEVICE AND MANUFACTURING METHOD THEREOF

CROSS-REFERENCE TO RELATED APPLICATIONS

This application is based upon and claims the benefit of priority from U.S. Provisional Application No. 62/344,719, filed on Jun. 2, 2016; the entire contents of which are incorporated herein by reference.

FIELD

An embodiment of the present invention relates to a semiconductor device and a manufacturing method thereof.

BACKGROUND

A semiconductor device includes, for example, a silicide used to reduce contact resistance between a diffusion layer and a contact. The silicide is formed, for example, by annealing a metal that is embedded in a bottom of a contact hole.

In the formation of the silicide layer in this manner, if the contact hole is deep, the metal cannot be adequately embedded in the bottom of the contact hole, which may cause an incomplete silicide layer. This may increase the contact resistance.

BRIEF DESCRIPTION OF THE DRAWINGS

FIG. 1 is a cross-sectional view of the main part of a semiconductor device according to this embodiment.

FIGS. 4 to 13 show a process for manufacturing the semiconductor device according to this embodiment.

DETAILED DESCRIPTION

Figure 2:
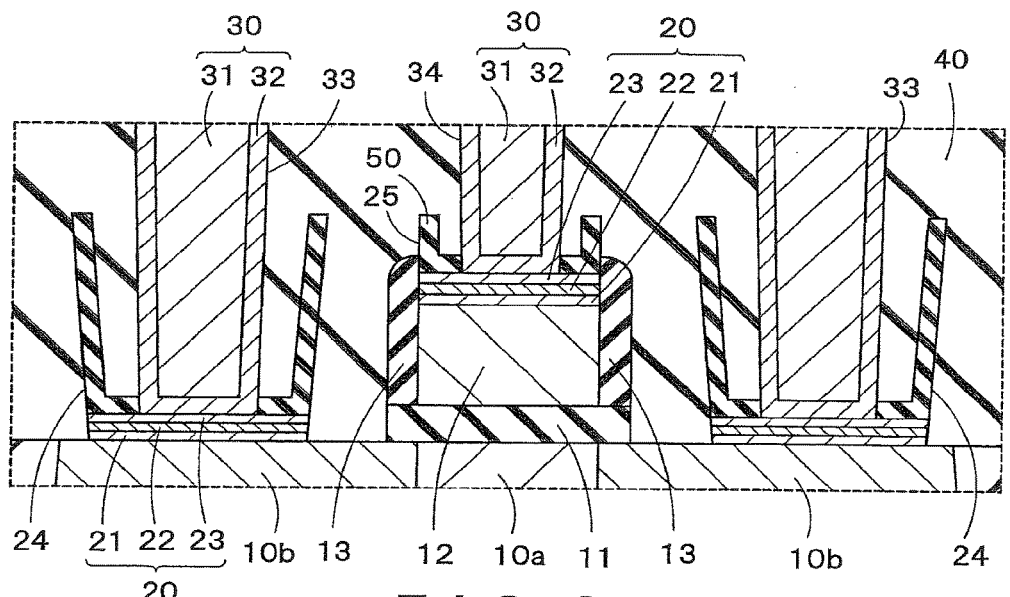
FIG. 2 is an enlarged view of the dotted region A in FIG. 1.

Embodiments will now be explained with reference to the accompanying drawings. The present invention is not limited to the embodiments.

The semiconductor device according to this embodiment includes a semiconductor layer, a plurality of diffusion layers in the semiconductor layer, a gate insulating film, a gate electrode, first contacts, and second contacts. The gate insulating film is on the semiconductor layer between the plurality of diffusion layers. The gate electrode is on the gate insulating film. The first contacts include silicide layers of the same material which is on the gate electrode and the diffusion layers respectively, and first metal layers on the silicide layers. The second contacts are on the first contacts.

The semiconductor device according to this embodiment may be used in a periphery circuit for, for example, a memory having a laminated structure with alternating electrode layers and insulating layers. It should be noted that the semiconductor device is not necessarily intended for use in such a periphery circuit.

FIG. 1 is a cross-sectional view of the main part of the semiconductor device according to this embodiment. As shown in FIG. 1, a semiconductor device 1 includes a substrate 10, gate insulating films 11, gate electrodes 12, side walls 13, contacts 20 (first contacts), contacts 30 (second contacts), and insulating layers 40 and 50.

The substrate 10 is, for example, a silicon substrate including semiconductor layers 10a, diffusion layers 10b, and shallow trench isolation (STI) 10c. The STI 10c are, for example, insulating layers of a silicon oxide ($SiO_2$).

Each gate insulating film 11 is on the semiconductor layer 10a between the diffusion layers 10b. Each gate electrode 12 is on the gate insulating film 11. Each side wall 13 covers the side surface of the gate electrode 12 and the side surface of the contact 20. The gate insulating films 11 and the side walls 13 include, for example, silicon oxide. The gate electrodes 12 include, for example, polysilicon.

In the semiconductor device 1 according to this embodiment, each diffusion layer 10b corresponds to a drain region or a source region. This means that the semiconductor device 1 corresponds to a metal insulator semiconductor (MIS) transistor. It should be noted that any number of MIS transistors of any type (conductivity type) can be used.

FIG. 2 is an enlarged view of the dotted region A in FIG. 1. As shown in FIG. 2, the contacts 20 is in contact holes 24 on the diffusion layers 10b, and in a contact hole 25 on the gate electrode 12 respectively. In this embodiment, the contact holes 24 correspond to first contact holes, and the contact holes 25 correspond to second contact holes.

In this embodiment, each contact 20 includes a silicide layer 21, a barrier metal layer 22 on the silicide layer 21, and a metal layer 23 on the barrier metal layer 22. In this embodiment, each barrier metal layer 22 corresponds to a first barrier metal layer, and each metal layer 23 corresponds to a first metal layer.

The silicide layers 21 include, for example, a compound of titanium (Ti) and silicon (titanium silicide). The barrier metal layers 22 include, for example, titanium nitride (TiN). The metal layers 23 include, for example, tungsten (W).

It should be noted that the structure of the contacts 20 are not limited to the above-described three-layer structure and may be a two-layer structure with the silicide layer 21 and the metal layer 23 instead. When the two-layer structure is used, the silicide layers 21 and the metal layers 23 can include, for example, tungsten nitride (WN) and tungsten, respectively.

The contacts 30 is in contact holes 33 inside the contact holes 24 and a contact hole 34 inside the contact hole 25 respectively. The bottom surface of each contact 30 is in contact with the top surface of the corresponding contact 20, so that they are electrically connected to each other. In this embodiment, the contact holes 33 and the contact hole 34 correspond to third contact holes.

Each contact 30 includes a metal layer 31 and a barrier metal layer 32 covering the side surface and the bottom surface of the metal layer 31. In this embodiment, the metal layer 31 corresponds to a second metal layer and the barrier metal layer 32 corresponds to a second barrier metal layer. The metal layer 31 includes, for example, tungsten which is the same material as that for the metal layer 23. The barrier metal layer 32 includes, for example, titanium nitride which is the same material as that for the barrier metal layer 22.

The insulating layers 40 include, for example, silicon oxide. The insulating layers 50 include, for example, silicon nitride (SiN). It should be noted that the insulating layers 40 are also outside the contact holes 24 and 25. The insulating layers 50 are also in the regions at the bottom surfaces of the contact holes 24 and 25, other than the regions where the contacts 20 and the contacts 30 are in contact with each other.

Figure 3:
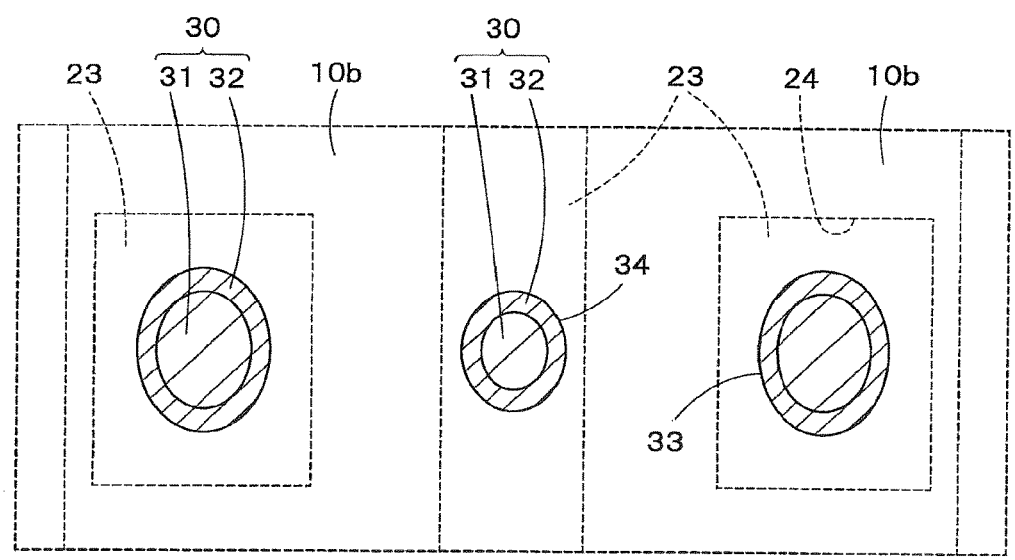
FIG. 3 is a schematic plan view of contacts 20 and 30.

FIG. 3 is a schematic plan view of the contacts 20 and 30. As shown in FIG. 3, at a contact portion between each contact 20 and the corresponding contact 30, the area of the top surface of the contact 20 (in FIG. 3, the metal layer 23) is larger than that of the bottom surface of the contact 30. Accordingly, the area of a contact between the contacts 20 and 30 stays nearly equal to that of the bottom surface of the contact 30 even if the area of the bottom surface of the contact 30 decreases or the contact 30 is misaligned. This ensures an electrical connection between the contact 20 and the contact 30 with low resistance. The contact 20 also includes the silicide layer 21 which reduces contact resistance between the diffusion layer 10b and the contact 20 and contact resistance between the gate electrode 12 and the contact 20.

A process for manufacturing the semiconductor device 1 according to this embodiment will now be explained with reference to FIGS. 4 to 13.

In FIG. 4, the semiconductor layer 10a and the STI 10c are formed in the substrate 10. The semiconductor layer 10a is formed, for example, by injection of an impurity. The STI 10c are formed, for example, by partially etching the semiconductor layer 10a to form trenches and filling the trenches with silicon oxide.

Subsequently, the gate insulating film 11 is formed on the substrate 10. The gate electrode 12 is formed on the gate insulating film 11. A cap layer 14 is formed on the gate electrode 12. The cap layer 14 includes, for example, silicon nitride. A resist 15 is formed on the cap layer 14. The resist 15 is processed into the layout pattern for the gate electrode 12.

The gate electrode 12 and the cap layer 14 are then etched using the resists 15 as a mask.

Subsequently, for example, silicon oxide is deposited and the resulting silicon oxide film is etched back, which causes the side walls 13 on the side surfaces of the gate insulating films 11 and the gate electrodes 12, as shown in FIG. 5. During this etch-back, part of the gate insulating film 11 above the substrates 10 is removed leaving part of the gate insulating film 11 under the gate electrodes 12 and the side walls 13.

An impurity is ion-injected to the substrate 10 from the top surface side, using the cap layers 14 and the side walls 13 as masks. Consequently, the diffusion layers 10b are formed in the substrates 10. Here, the impurity is of the conductivity type opposite to that of the semiconductor layers 10a. Consequently, the conductivity type of the diffusion layers 10b is opposite to that of the semiconductor layers 10a.

Subsequently, the insulating layer 40 is deposited on the diffusion layers 10b, the side walls 13, and the cap layers 14. As shown in FIG. 6, the contact holes 24 are formed in the insulating layer 40. The contact holes 24 pass through the insulating layer 40 and expose the diffusion layers 10b. This gives a state ready for formation of the contacts 20 on the diffusion layers 10b. The contact holes 24 are formed, for example, by reactive ion etching (RIE).

After the contact holes 24 are formed, as shown in FIG. 7, the cap layers 14 are removed. By removal of the cap layers 14, the contact holes 25 are formed. Thus the gate electrodes 12 exposes at the bottoms of the contact holes 25, which gives a state ready for formation of the contacts 20 on the gate electrodes 12.

Subsequently, as shown in FIG. 8, the contacts 20 are formed on the diffusion layers 10b and the gate electrodes 12 respectively. At this time, the bottom layer of each contact 20 is not a silicide layer 21 but a titanium layer serving as a silicide formation metal layer.

The contacts 20 are formed, for example, by sputtering. In this embodiment, the contacts 20 are formed not only on the diffusion layers 10b and the gate electrodes 12 but also on the insulating layers 40. At this time, the contacts 20 should not preferably be formed on the inner surfaces of the contact holes 24, although no problem arises even if some is formed thereon.

Figure 10:
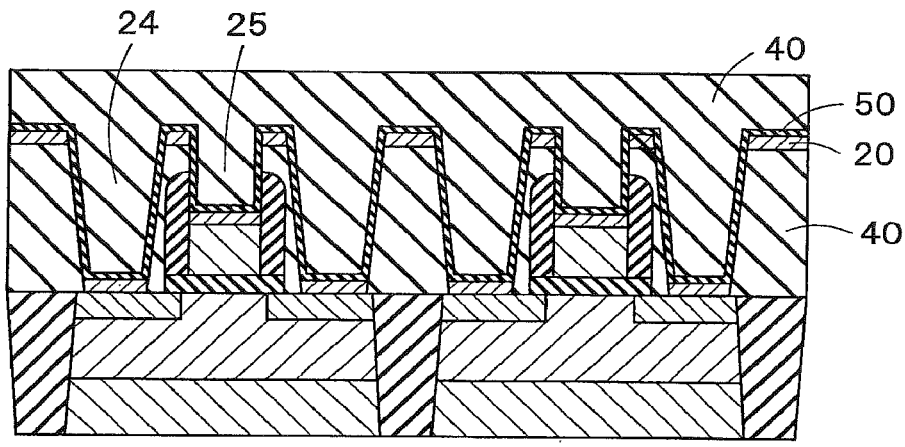

After formation of contacts 20, as shown in FIG. 9, the insulating layer 50 is formed so that it can cover the contacts 20. After formation of the insulating layer 50, as shown in FIG. 10, an insulating layer 40 is embedded in the contact holes 24 and the contact holes 25. At this time, the insulating layer 50 is covered with the insulating layer 40.

Figure 11:
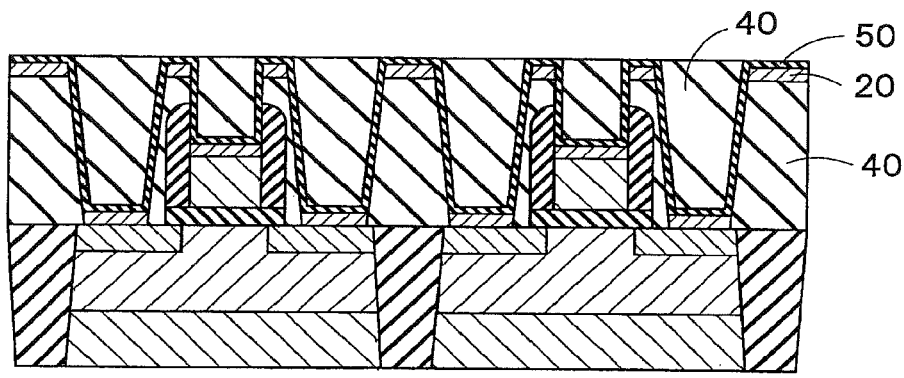

Subsequently, as shown in FIG. 11, part of the insulating layer 40 formed in the step shown in FIG. 10 is removed, for example, by chemical mechanical polishing (CMP). The step partly exposes the insulating layer 50 again with the insulating layers 40 left embedded in the contact holes 24 and the contact holes 25.

Figure 12:
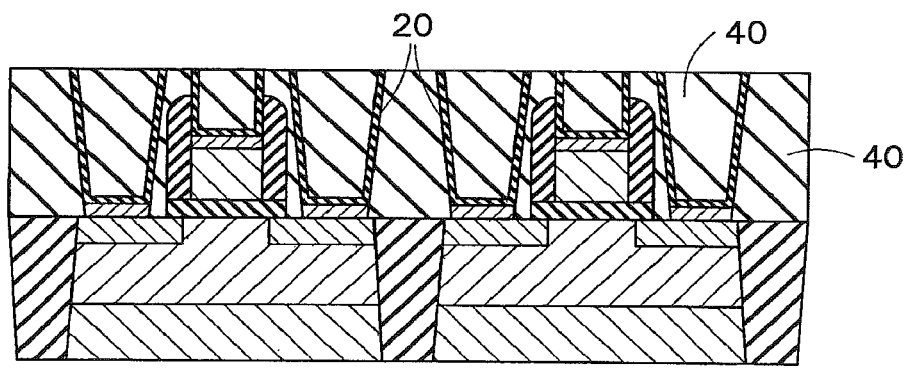

Subsequently, part of the insulating layer 50 exposed in the step shown in FIG. 11 and the contacts 20 under the insulating layer 50 are etched as shown in FIG. 12. This step electrically insulates the adjacent contacts 20 (the contacts 20 in the contact holes 24) on the diffusion layers 10b.

A process for manufacturing a laminated memory adjacent to the semiconductor device 1 (not shown in the drawing) is then conducted. Afterwards, the insulating layer 40 is formed again above the contacts 20. Annealing in the process for manufacturing the laminated memory transforms the bottom titanium layer of each contact 20 into the silicide layer 21.

Figure 13:
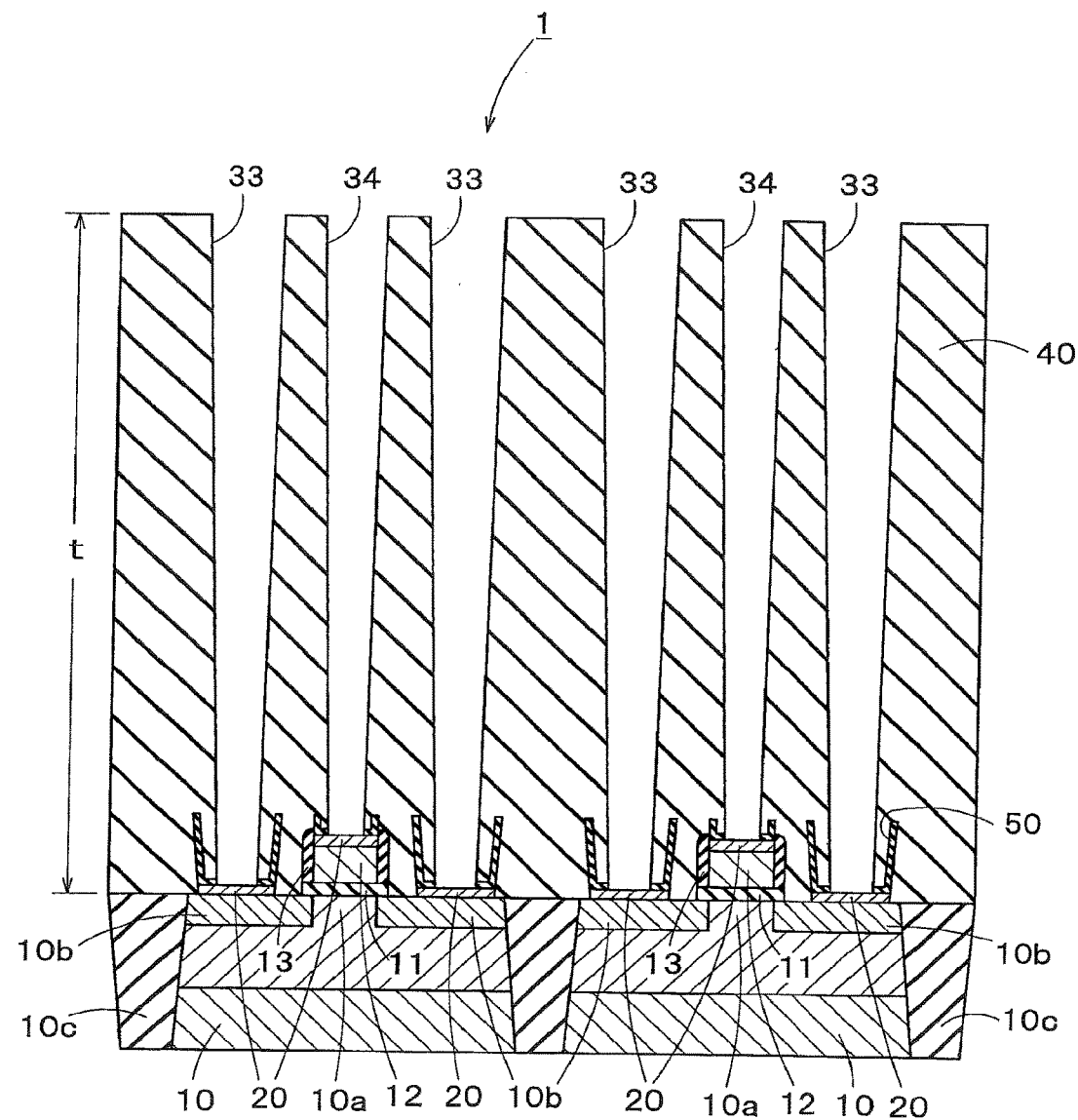

After formation of the insulating layer 40, as shown in FIG. 13, the contact holes 33 and the contact holes 34 are concurrently formed. The contact holes 33 pass through the insulating layer 40 and expose the contacts 20 on the diffusion layers 10b. The contact holes 34 pass through the insulating layer 40 and expose the contacts 20 on the gate electrodes 12. This gives a state ready for formation of the contacts 30 on the contacts 20.

In the step shown in FIG. 13, when the thickness t of the insulating layer 40 is large, the contact holes 33 and 34 may be formed in two steps. For example, the lower parts of the contact holes 33 and 34 may be first formed when the thickness of the insulating layer 40 reaches almost half (t/2) and the upper parts of the contact holes 33 and 34 may be then formed when the thickness of the insulating layer 40 reaches t.

Subsequently, as shown in FIG. 1, the contacts 30 are embedded in the contact holes 33 and 34. At this time, as shown in FIG. 2, at the bottoms of the contact holes 33 and 34, the barrier metal layers 32 are formed on the metal layers 23 and the metal layers 31 are formed on the barrier metal layers 32.

Wires and other components are then formed on the metal layers 31. Thus, the semiconductor device 1 according to this embodiment is completed.

In the above-described process for manufacturing the semiconductor device 1 according to this embodiment, if the contacts 20 are not formed, the silicide layers 21 should be formed on the respective gate electrodes 12 and the diffusion layers 10b via the contact holes 33 and 34. In the case where the semiconductor device 1 is provided in a periphery circuit for the laminated memory, the thickness t of the insulating layers 40 (see FIG. 13) increases as the capacity of the laminated memory increases (as the number of the electrode layer increases). As the thickness t of the insulating layers 40 increases, the depth of the contact holes 33 and 34 increases.

The larger the depth of the contact holes 33 and 34, the more difficult the formation of the silicide layers 21 on the gate electrodes 12 and the diffusion layers 10b. In the case where the contact holes 33 are 34 formed in two steps, it becomes more difficult to form the silicide layers 21 if the center axis of the lower part deviates from that of the upper part in each contact hole.

On the contrary, according to this embodiment, the silicide layers 21 is already on the gate electrodes 12 and the diffusion layers 10b in the step of forming the contact holes 33 and 34. In other words, the silicide layers 21 can be formed on the drain regions and the source regions not through the contact holes 33, and on the gate electrodes 12 not through the contact holes 34. This allows the silicide layers 21 having an adequate thickness to be formed on the gate electrodes 12 and the diffusion layers 10b, regardless of the depth of the contact holes 33 and 34 and the deviations of their center axis. This leads to reductions in contact resistance between the gate electrodes 12 and the contacts 20 and contact resistance between the diffusion layers 10b and the contacts 20.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A semiconductor device comprising:
a semiconductor layer;
a plurality of diffusion layers in the semiconductor layer;
a gate insulating film on the semiconductor layer between the plurality of diffusion layers;
a gate electrode on the gate insulating film;
first contacts including silicide layers of the same material on the gate electrode and the diffusion layers respectively, and first metal layers on the silicide layers; and
second contacts on the first contacts, wherein
the silicide layers and the first metal layers are plate shape,
an area of a top surface of each first contact is larger than an area of a bottom surface of each second contact,
a contact portion between each first contact and each second contact is only the top surface of each first contact and the bottom surface of each second contact,
each first contact further includes a first barrier metal layer between the silicide layer and the first metal layer,
each second contact includes
 a second barrier metal layer that includes the same material as that of the first barrier metal layer and is connected to the first metal layer, and
 a second metal layer that includes the same material as that of the first metal layer and is connected to the first metal layer via the second barrier metal layer, and
the silicide layers include titanium (Ti),
the first metal layers and the second metal layers include tungsten (W), and
the first barrier metal layers and the second barrier metal layers include titanium nitride (TiN).

* * * * *